(12) United States Patent
Seki et al.

(10) Patent No.: US 10,256,401 B2
(45) Date of Patent: Apr. 9, 2019

(54) MEMORY DEVICE WITH MULTIPLE INTERCONNECT LINES

(71) Applicant: Toshiba Memory Corporation, Minato-ku (JP)

(72) Inventors: Harumi Seki, Kawasaki (JP); Takayuki Ishikawa, Yokkaichi (JP); Masumi Saitoh, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/704,874

(22) Filed: Sep. 14, 2017

(65) Prior Publication Data
US 2018/0269391 A1    Sep. 20, 2018

(30) Foreign Application Priority Data

Mar. 17, 2017    (JP) .................................. 2017-053677

(51) Int. Cl.
*H01L 29/02* (2006.01)
*H01L 47/00* (2006.01)
(Continued)

(52) U.S. Cl.
CPC ...... *H01L 45/1233* (2013.01); *H01L 27/2436* (2013.01); *H01L 45/146* (2013.01)

(58) Field of Classification Search
CPC .............. H01L 45/1233; H01L 45/146; H01L 27/2436
See application file for complete search history.

(56) References Cited

U.S. PATENT DOCUMENTS 6,992,349 B2 * 1/2006 Lee .................... G11C 16/3427
                                                    257/324
9,018,613 B2    4/2015 Nojiri et al.
(Continued)

FOREIGN PATENT DOCUMENTS

JP    2010-287872    12/2010
JP    2014-36034    2/2014
(Continued)

OTHER PUBLICATIONS

Xiaoxin Xu et al., "Fully CMOS Compatible 3D Vertical RRAM with Self-aligned Self-selective Cell Enabling Sub-5nm Scaling," 2016 Symposium on VLSI Technology Digest of Technical Papers, 2016, pp. 2.

*Primary Examiner* — Ismail A Muse
(74) *Attorney, Agent, or Firm* — Oblon, McClelland, Maier & Neustadt, L.L.P.

(57) ABSTRACT

According to one embodiment, a memory device includes a first interconnect, a second interconnect, a first layer, a second layer. The first interconnect includes a first region and a second region. The first region extends in a first direction and includes a first metallic element. The second region extends in the first direction and includes the first metallic element and nitrogen. The second interconnect extends in a second direction crossing the first direction. A portion of the second region is positioned between the second interconnect and a portion of the first region. The first layer is provided between the second interconnect and the portion of the second region. The second layer is provided between the first layer and the second interconnect. The second layer includes at least one of silicon or a second oxide. The silicon is monocrystalline, polycrystalline, or amorphous.

14 Claims, 8 Drawing Sheets

(51) Int. Cl.
    *H01L 45/00*     (2006.01)
    *H01L 27/24*     (2006.01)

(56) References Cited

U.S. PATENT DOCUMENTS

| | | | |
|---|---|---|---|
| 9,281,345 B2 | 3/2016 | Kanno et al. | |
| 2008/0173928 A1* | 7/2008 | Arai | H01L 27/11556 |
| | | | 257/316 |
| 2009/0289251 A1* | 11/2009 | Kiyotoshi | H01L 27/1021 |
| | | | 257/43 |
| 2010/0219392 A1 | 9/2010 | Awaya et al. | |
| 2012/0091419 A1* | 4/2012 | Chen | H01L 45/08 |
| | | | 257/4 |
| 2012/0135573 A1* | 5/2012 | Kim | H01L 27/10873 |
| | | | 438/270 |
| 2013/0295726 A1* | 11/2013 | Tang | H01L 27/112 |
| | | | 438/128 |
| 2015/0054056 A1* | 2/2015 | Yasuda | H01L 21/28282 |
| | | | 257/324 |
| 2015/0263278 A1* | 9/2015 | Ode | H01L 27/2454 |
| | | | 257/5 |
| 2018/0269211 A1* | 9/2018 | Kim | H01L 27/10852 |

FOREIGN PATENT DOCUMENTS

| | | |
|---|---|---|
| JP | 2014-39007 | 2/2014 |
| JP | 2015-19048 | 1/2015 |

* cited by examiner

MEMORY DEVICE WITH MULTIPLE INTERCONNECT LINES

CROSS-REFERENCE TO RELATED APPLICATIONS

This application is based upon and claims the benefit of priority from Japanese Patent Application No. 2017-053677, filed on Mar. 17, 2017; the entire contents of which are incorporated herein by reference.

FIELD

Embodiments described herein relate generally to a memory device.

BACKGROUND

A memory device that uses a variable resistance element has been proposed. Stable operations of the variable resistance element are desirable.

DETAILED DESCRIPTION

According to one embodiment, a memory device includes a first interconnect, a second interconnect, a first layer, a second layer. The first interconnect includes a first region and a second region. The first region extends in a first direction and includes a first metallic element. The second region extends in the first direction and includes the first metallic element and nitrogen. The second interconnect extends in a second direction crossing the first direction. A portion of the second region is positioned between the second interconnect and a portion of the first region. The first layer is provided between the second interconnect and the portion of the second region. The first layer includes a first oxide including at least one element selected from the group consisting of hafnium (Hf), zirconium (Zr), nickel (Ni), tantalum (Ta), tungsten (W), cobalt (Co), aluminum (Al), iron (Fe), manganese (Mn), chrome (Cr), vanadium (V), titanium (Ti), and niobium (Nb). The second layer is provided between the first layer and the second interconnect. The second layer includes at least one of silicon or a second oxide. The silicon is monocrystalline, polycrystalline, or amorphous. The second oxide includes at least one element selected from the group consisting of hafnium (Hf), zirconium (Zr), nickel (Ni), tantalum (Ta), tungsten (W), cobalt (Co), aluminum (Al), iron (Fe), manganese (Mn), chrome (Cr), vanadium (V), titanium (Ti), and niobium (Nb).

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

Figure 1A:
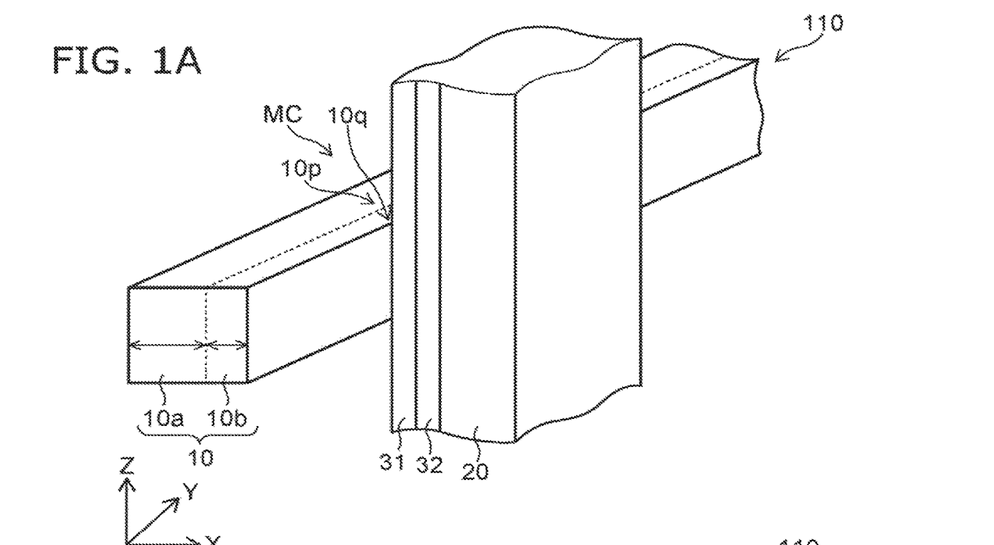
FIG. 1A and FIG. 1B are schematic views illustrating a memory device according to a first embodiment.
Figure 1B:
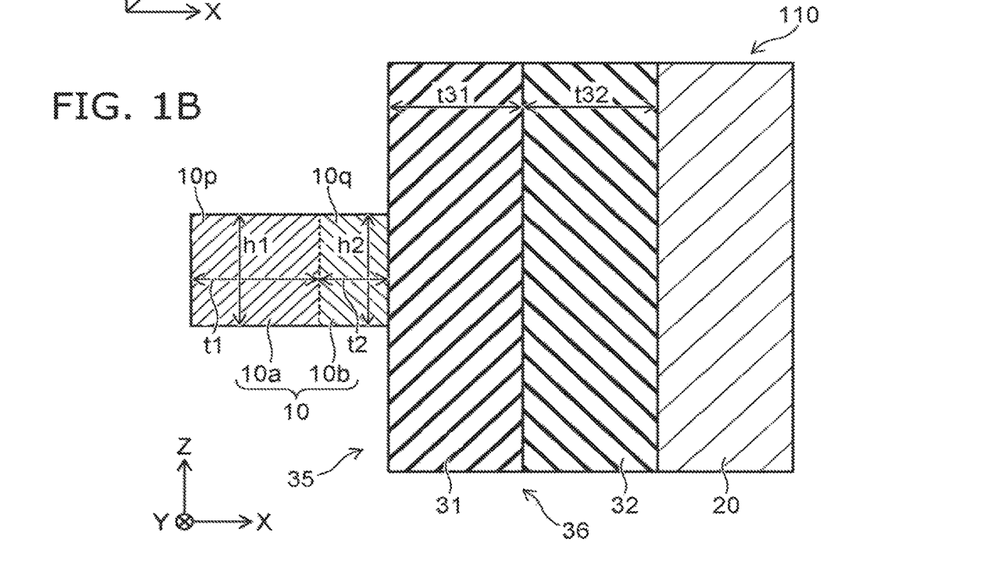

FIG. 1A and FIG. 1B are schematic views illustrating a memory device according to a first embodiment. FIG. 1A is a perspective view. FIG. 1B is a cross-sectional view.

As shown in FIG. 1A and FIG. 1B, the memory device 110 according to the embodiment includes a first interconnect 10, a second interconnect 20, a first layer 31, and a second layer 32.

The first interconnect 10 extends in a first direction.

The first direction corresponds to a Y-axis direction. A direction perpendicular to the Y-axis direction is taken as an X-axis direction. A direction perpendicular to the Y-axis direction and the X-axis direction is taken as a Z-axis direction.

The first interconnect 10 includes a first region 10a and a second region 10b. The first region 10a extends in the first direction (the Y-axis direction). The first region 10a includes a first metallic element. The first metallic element is tungsten (W). Examples of the first metallic element are described below. The second region 10b extends in the first direction (the Y-axis direction). The second region 10b includes the first metallic element and nitrogen. The second region 10b includes, for example, a nitride of the first metallic element. In the case where the first metallic element is W, the second region 10b includes WN.

For example, the second region 10b may be formed by providing a layer of the first metallic element and by nitriding a surface portion of the layer. The portion of the layer that is not nitrided is used to form the first region 10a.

There are cases where the boundary between the first region 10a and the second region 10b is distinct. Or, there are also cases where the boundary is indistinct. An intermediate region of the first region 10a and the second region 10b may exist between the two.

The second interconnect 20 extends in a second direction. The second direction crosses the first direction (the Y-axis direction). The second direction is, for example, the Z-axis direction. The second interconnect 20 includes, for example, polysilicon, etc. Examples of the material of the second interconnect 20 are described below.

A portion 10q of the second region 10b is positioned between the second interconnect 20 and a portion 10p of the first region 10a.

The first layer 31 is provided between the second interconnect 20 and the portion 10q of the second region 10b recited above. The first layer 31 includes a first oxide. The first oxide is an oxide including at least one element selected from the group consisting of hafnium (Hf), zirconium (Zr), nickel (Ni), tantalum (Ta), tungsten (W), cobalt (Co), aluminum (Al), iron (Fe), manganese (Mn), chrome (Cr), vanadium (V), titanium (Ti), and niobium (Nb). The first oxide is, for example, $HfO_x$.

For example, the first layer 31 contacts the second region 10b. For example, the first layer 31 may contact the second layer 32.

The second layer 32 is provided between the first layer 31 and the second interconnect 20. The second layer 32 includes at least one of silicon or a second oxide. The silicon is monocrystalline, polycrystalline, or amorphous. The second oxide is an oxide including at least one element selected from the group consisting of hafnium (Hf), zirconium (Zr), nickel (Ni), tantalum (Ta), tungsten (W), cobalt (Co), aluminum (Al), iron (Fe), manganese (Mn), chrome (Cr), vanadium (V), titanium (Ti), and niobium (Nb).

The first interconnect 10 functions as, for example, a word line. The second interconnect 20 functions as, for example, a bit line (e.g., a local bit line). The crossing portion between the first interconnect 10 and the second interconnect 20 functions as one memory cell MC. The electrical resistance of the memory cell MC changes according to the voltage applied to the memory cell MC. Multiple states of the electrical resistance are utilized as memory information.

In the memory device 110, the second layer 32 functions as a variable resistance portion 36 (e.g., a memory layer referring to FIG. 1B). On the other hand, the stacked structure of the second region 10b and the first layer 31 functions as a rectifying portion 35 having a good characteristic (referring to FIG. 1B).

As described below, it was found that a good rectifying characteristic is obtained by using the combination of the first layer 31 and the second region 10b including the nitride of the designated first metallic element. The combination is used as the rectifying portion 35.

In a memory device that uses a variable resistance layer, generally, the variable resistance layer and a rectifying element (e.g., a p-n diode, etc.) are connected in series. In such a configuration, the reduction of the size (the thickness) of the rectifying element is limited.

Conversely, the thickness (the length in the X-axis direction) of the rectifying portion 35 according to the embodiment (the combination of the second region 10b and the first layer 31) is thin. Thereby, the density of the multiple memory cells can be increased. In high density memory cells as well, stable operations are possible due to the rectifying portion 35. According to the embodiment, a memory device can be provided in which stable operations are possible.

An example of operations of the memory device 110 will now be described. The case where the second layer 32 includes the second oxide will now be described.

FIG. 2A to FIG. 2D are schematic views illustrating the operations of the memory device according to the first embodiment.

Figure 2A:
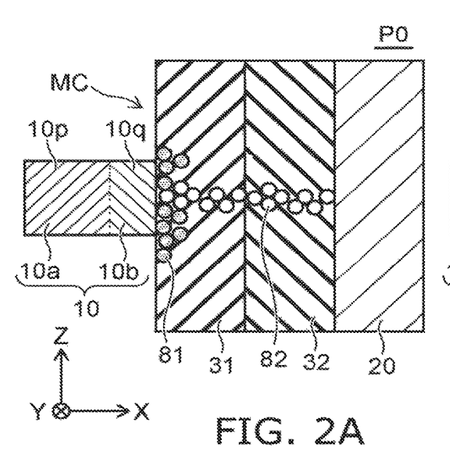
FIG. 2A to FIG. 2D are schematic views illustrating the operations of the memory device according to the first embodiment.
Figure 2B:
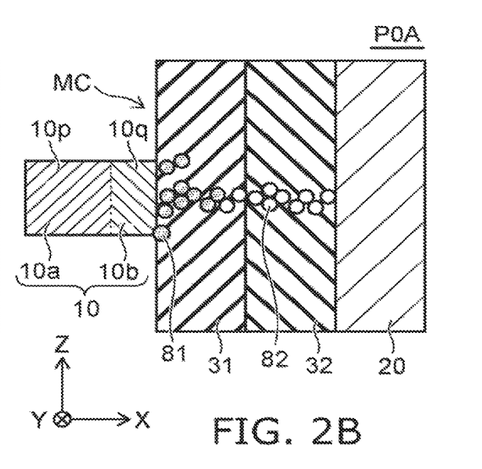
Figure 2C:
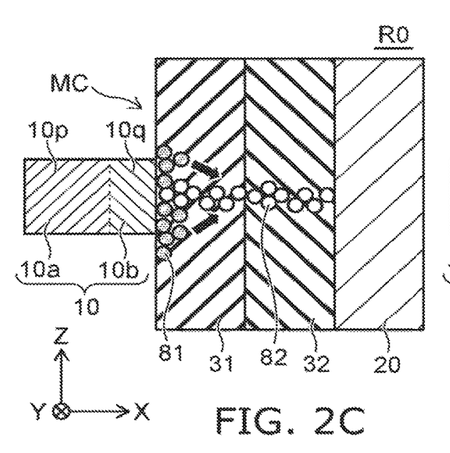
Figure 2D:
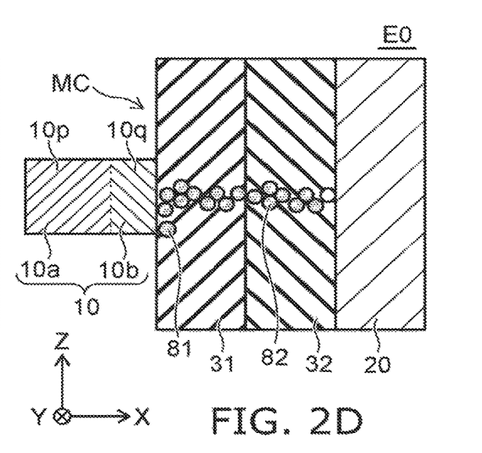

FIG. 2A corresponds to a program operation PO. FIG. 2B corresponds to a state POA after the program operation PO. FIG. 2C corresponds to a read operation RO. FIG. 2D corresponds to an erase operation EO. The program operation PO corresponds to, for example, a set operation. The erase operation EO corresponds to, for example, a reset operation.

As shown in FIG. 2A, a programming voltage Vset is applied to the first interconnect 10 in the program operation PO. The programming voltage Vset is positive when referenced to the potential of the second interconnect 20. In the first layer 31 and the second layer 32, oxygen 81 is ionized and moved to the vicinity of the first interconnect 10 by the electric field. Oxygen vacancies 82 occur in the first layer 31 and the second layer 32 when the oxygen 81 moves. The oxygen vacancies 82 become a filament; and a conduction path is formed. Thereby, a low resistance state is formed. The low resistance state is programmed to the memory cell MC.

FIG. 2B corresponds to when the programming voltage Vset is removed (when the programming voltage Vset is interrupted) from the low resistance state. As shown in FIG. 2B, the filament of the oxygen vacancies 82 disappears spontaneously when the programming voltage Vset is removed. It is considered that this is because the energy of the oxygen 81 diffusing inside the first layer 31 is lower than the energy of the oxygen 81 concentrated at the vicinity of the first interconnect 10 and binding with the material of the first interconnect 10. The oxygen 81 is energetically stable when diffused inside the first layer 31.

In the read operation RO as shown in FIG. 2C, a read voltage Vread is applied to the first interconnect 10. The read voltage Vread is positive when referenced to the potential of the second interconnect 20. The read voltage Vread is set to be lower than the programming voltage Vset. In the case where the second layer 32 is in the low resistance state, the oxygen 81 in the first layer 31 is moved by the read voltage Vread; and a filament (a conduction path) due to the oxygen vacancies 82 is formed. Accordingly, the memory cell MC is set to the low resistance state. Thereby, the low resistance state of the second layer 32 can be read. On the other hand, in the case where the second layer 32 is in the high resistance state, even if the read voltage Vread is applied to the first interconnect 10, the first layer 31 is not changed from the high resistance state because the electric field is insufficient. Therefore, the memory cell MC is in the high resistance state; and the high resistance state of the second layer 32 is read.

In the erase operation EO as shown in FIG. 2D, an erasing voltage Vreset is applied to the second interconnect 20. The erasing voltage Vreset is positive when referenced to the potential of the first interconnect 10. In other words, in the erase operation EO, a negative voltage (a negative potential) when referenced to the potential of the second interconnect 20 is applied to the first interconnect 10. The oxygen 81 that was localized at the vicinity of the first interconnect 10 is diffused inside the first layer 31 and the second layer 32. Thereby, the filament (the conduction path) due to the oxygen vacancies 82 disappears. Thereby, the memory cell MC transitions to the high resistance state.

Thus, in the memory device 110, the program operation PO, the read operation RO, and the erase operation EO are implemented.

Other than when the programming voltage Vset or the read voltage Vread is applied, the first layer 31 is in the high resistance state. Accordingly, the first layer 31 functions as a rectifying layer.

In the case where the multiple memory cells MC are provided as described below, current flows around to the unselected memory cells MC due to effects of the program operation PO, the read operation RO, and the erase operation EO of the other memory cells MC (the selected memory cells MC). A leakage current occurs in the unselected memory cells MC.

Such a leakage current can be suppressed by the first layer 31 (the rectifying layer). A memory device can be provided in which stable operations are possible.

In the example recited above (the example of FIG. 4A to FIG. 4D), the second layer 32 includes the second oxide; and a filament (a conduction path) is formed due to the oxygen vacancies 82 in the second layer 32. In the embodiment, the resistance change of the second layer 32 (the memory layer) may occur due to another mechanism. For example, the resistance of the layer may change due to an oxygen-containing region that has a planar configuration and moves along the thickness direction of the layer. In such a case as well, a similar rectifying function is obtained.

For example, there is memory in which a filament is formed of metal ions inside the second layer 32 due to a voltage application causing ionization of the metal contacting the second layer 32. In such memory, there is a possibility that in the case where the first layer 31 is provided, the resistance change due to the filament of the oxygen vacancies 82 may be impeded by the metal ions diffusing inside the first layer 31. By the second interconnect 20 including a material that does not ionize easily, the ionization of the metal inside the second layer 32 due to the voltage application can be suppressed.

For example, by using polysilicon as the second interconnect 20, the formation of the filament by the metal ions recited above can be suppressed; and the filament of the oxygen vacancies 82 can be formed stably. Thereby, stable operations are obtained.

As recited above, the oxygen 81 that moves to the vicinity of the first interconnect 10 due to the application of an applied voltage Vap diffuses spontaneously inside the first layer 31 when the applied voltage Vap is removed. Thereby, a rectifying characteristic is obtained. It was found that the ease of the spontaneous transition of the first layer 31 to the high resistance state is dependent on the material contacting the first layer 31 (the material of the first interconnect 10).

As described below, it was found by experiment that different rectifying characteristics are obtained by modifying the material of the first interconnect 10. The experiment will now be described.

Figure 3:
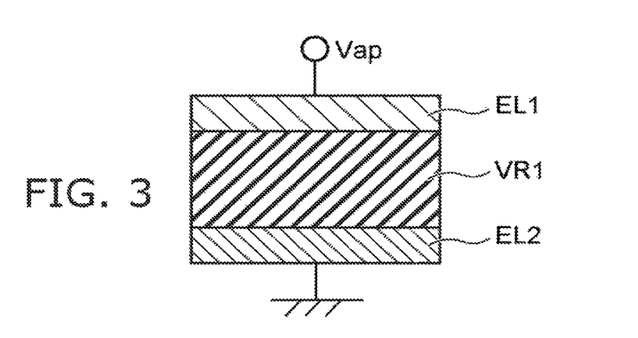
FIG. 3 is a schematic cross-sectional view illustrating the sample of the experiment relating to the memory device.

FIG. 3 is a schematic cross-sectional view illustrating the sample of the experiment relating to the memory device.

As shown in FIG. 3, a first electrode EL1, a second electrode EL2, and a variable resistance layer VR1 that is provided between the first electrode EL1 and the second electrode EL2 are provided in the samples. In the experiment, the variable resistance layer VR1 is HfO$_x$. The second electrode EL2 is TiN. In the experiment, the material of the first electrode EL1 is modified. The applied voltage Vap that is referenced to the second electrode EL2 is applied to the first electrode EL1. The applied voltage Vap corresponds to the programming voltage Vset, the read voltage Vread, etc. The current that flows between the first electrode EL1 and the second electrode EL2 is measured when sweeping the applied voltage Vap. This measurement corresponds to a program sweep. Subsequently, the current that flows between the first electrode EL1 and the second electrode EL2 is measured when re-sweeping the applied voltage Vap. This measurement corresponds to a read sweep.

FIG. 4A to FIG. 4D are graphs illustrating the experimental results relating to the memory device.

FIG. 4A to FIG. 4D correspond respectively to first to fourth samples SP01 to SP04. In the first sample SP01, the first electrode EL1 is Pt. In the second sample SP02, the first electrode EL1 is TiN. In the third sample SP03, the first electrode EL1 is W. In the fourth sample SP04, the first electrode EL1 is WN.

The horizontal axis of these figures is the applied voltage Vap. The vertical axis is a current Ic flowing between the first electrode EL1 and the second electrode EL2. The solid line corresponds to the program sweep PS (i.e. forward program sweep PSF and reverse program sweep PSR). The broken line corresponds to the read sweep RS.

Figure 4A:
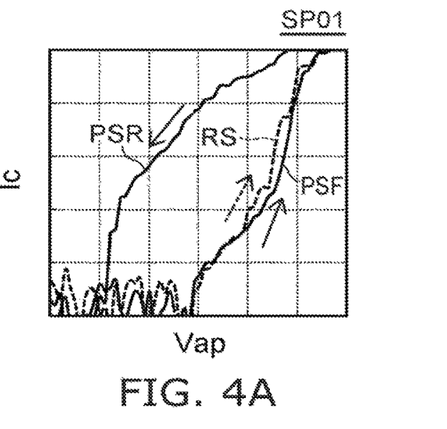
FIG. 4A to FIG. 4D are graphs illustrating the experimental results relating to the memory device.
Figure 4B:
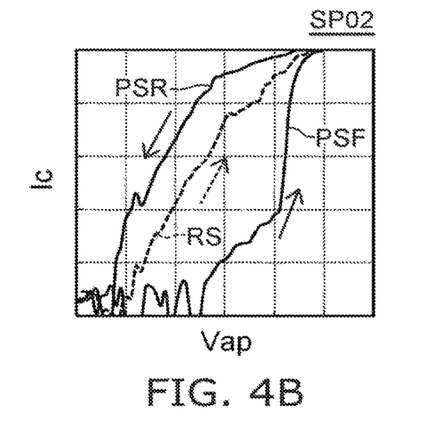
Figure 4C:
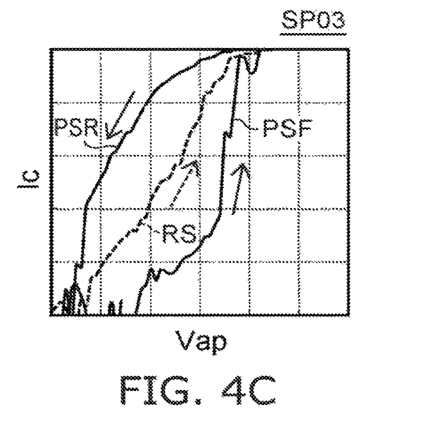
Figure 4D:
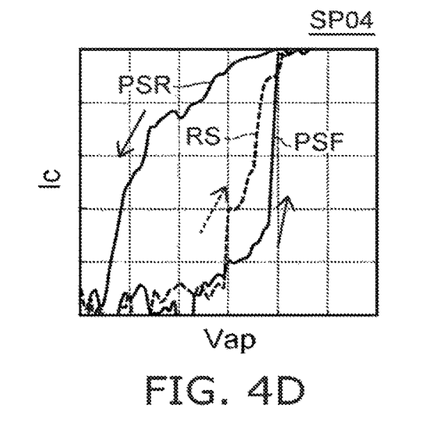

For the first sample SP01 (the Pt electrode) as shown in FIG. 4A, the current Ic of the read sweep RS substantially matches the current Ic of the forward program sweep PSF. For the second sample SP02 (the TiN electrode) as shown in FIG. 4B, the current Ic of the read sweep RS is greatly shifted from the current Ic of the forward program sweep PSF. For the third sample SP03 (the W electrode) as shown in FIG. 4C as well, the current Ic of the read sweep RS is shifted from the current Ic of the forward program sweep PSF. The amount of the shift of the third sample SP03 is smaller than the amount of the shift of the second sample SP02. For the fourth sample SP04 (the WN electrode) as shown in FIG. 4D, the current Ic of the read sweep RS is near the current Ic of the forward program sweep PSF.

Thus, it was found that the difference between the current Ic of the read sweep RS and the current Ic of the forward program sweep PSF changes due to the material of the electrode. By setting the difference to be small, a good selector operation (a good rectifying operation) is obtained. When the difference is large, the programmed state changes undesirably due to the read operation RO; and it is difficult to obtain stable memory operations.

The evaluation parameter (the rectifying factor) described below can be derived from the characteristics of the experimental results illustrated in FIG. 4A to FIG. 4D, etc.

Figure 5A:
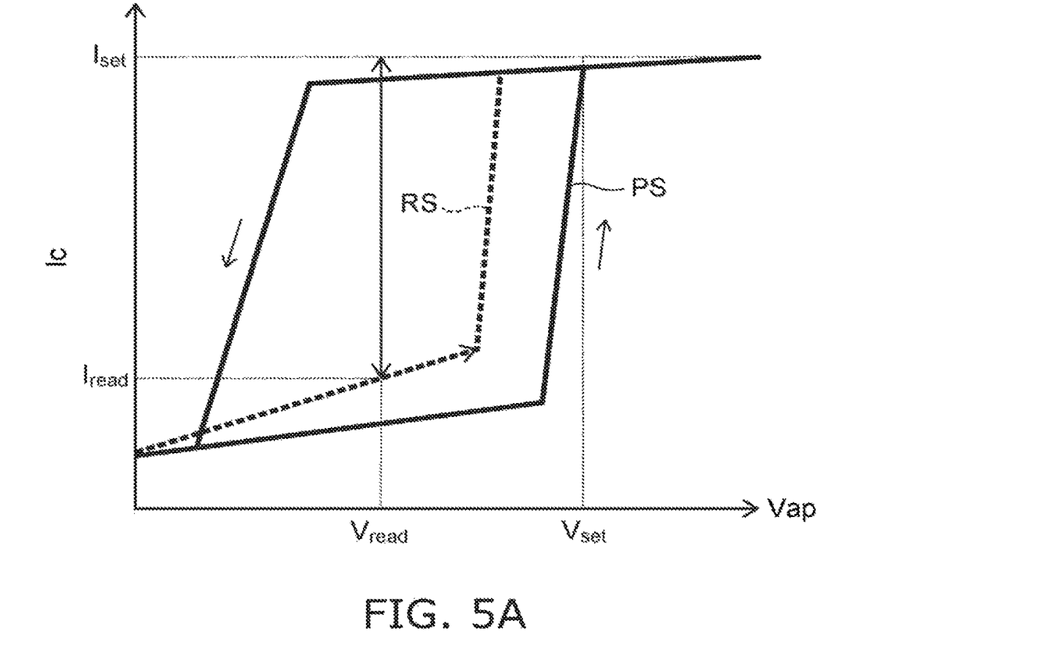
FIG. 5A and FIG. 5B are schematic views illustrating experimental results relating to the memory device.
Figure 5B:
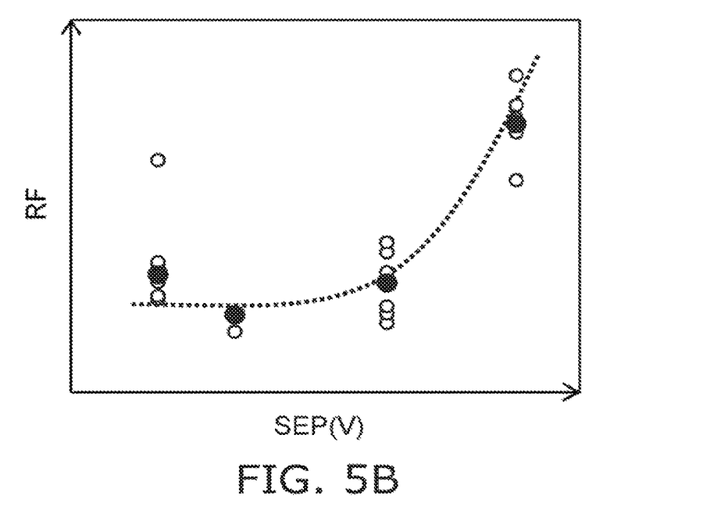

FIG. 5A and FIG. 5B are schematic views illustrating experimental results relating to the memory device.

FIG. 5A shows a rectifying factor RF. FIG. 5B shows an experimental result of the rectifying factor RF.

The horizontal axis of FIG. 5A is the applied voltage Vap. The vertical axis is the current Ic. As shown in FIG. 5A, the programming voltage Vset is set for the characteristic of the program sweep PS. The read voltage Vread is set for the read sweep RS. The current Ic corresponds to a program state current Iset when the applied voltage Vap is the programming voltage Vset. The current Ic corresponds to a read state current Iread when the applied voltage Vap is the read voltage Vread.

The rectifying factor RF is defined as Iset/Iread. A large rectifying factor RF corresponds to the characteristic of the read sweep RS being near the characteristic of the program sweep PS. The read state current Iread is smaller for a larger rectifying factor RF. The spontaneous transition to the state having the higher resistance occurs more easily for a larger rectifying factor RF.

FIG. 5B shows the rectifying factor RF of the multiple samples having different materials of the first electrode EL1 The horizontal axis of FIG. 5B is a standard electrode potential SEP (V) of the first electrode EL1. The vertical axis is the rectifying factor RF. The white round symbols in FIG. 5B correspond to the rectifying factor RF for each of the multiple elements. The black round symbols are the median values of the rectifying factor RF for the samples having the same standard electrode potential SEP.

It can be seen from FIG. 5B that, as the standard electrode potential SEP increases, the rectifying factor RF increases; and a good characteristic is obtained.

A material that has a large standard electrode potential SEP does not oxidize easily. Therefore, it can be seen that the spontaneous transition to the high resistance state occurs easily as the difficultly of the oxidization increases for the electrode (the first electrode EL1) to which the programming voltage Vset is applied.

Accordingly, for example, it is favorable to use a material having a large standard electrode potential SEP (i.e., a material that does not oxidize easily) as the first interconnect 10. For example, platinum (Pt), gold (Au), palladium (Pd), etc., are examples of materials having large standard electrode potentials SEP. These materials are expensive noble metals and therefore are not favorable for mass production and are not practical.

For example, a portion (the second region 10b) that does not oxidize easily is formed by nitriding a portion of the surface of the tungsten (W) used as the first interconnect 10. By using a structure in which the second region 10b contacts the first layer 31, a good rectifying property can be obtained without using an expensive material.

In the embodiment, the second region 10b of the first interconnect 10 includes a nitride of the first metallic element. The first metallic element includes, for example, at least one selected from the group consisting of tungsten (W) and tantalum (Ta). The oxidization is suppressed further by providing the second region 10b including the nitride of the first metallic element. Thereby, a large rectifying factor RF is obtained. The first layer 31 easily transitions to the high resistance state spontaneously. A good selector operation (a good rectifying operation) is obtained. Thereby, stable operations are obtained.

The electrical resistivity of the first region 10a is low compared to the electrical resistivity of the second region 10b. The first interconnect 10 that has a low resistance is obtained. The signal delay of the first interconnect 10 is suppressed; and stable operations are obtained.

The resistance of the first layer 31 is reduced by applying a prescribed voltage. By the removal (the interruption) of the voltage, the resistance of the first layer 31 transitions quickly to the original high resistance state.

It is favorable for the oxygen composition ratio of the first oxide included in the first layer 31 to be about the same as the stoichiometric oxygen composition ratio of the first oxide or lower than the stoichiometric oxygen composition ratio of the first oxide. Thereby, for example, the oxygen 81 moves easily from the second layer 32 toward the first layer 31; and the oxygen vacancies occur easily in the second layer 32. The filament (the conduction path) due to the oxygen vacancies 82 is formed easily. A stable low resistance state is obtained easily.

For example, the first oxide includes hafnium. The first oxide includes, for example, $HfO_x$. The stoichiometric oxygen composition ratio (x) of $HfO_x$ is 2. In the first oxide, it is favorable for x to be substantially 2 or less than 2. For example, the first oxide may include $HfO_x$ ($1.5 \leq x < 2.0$).

The resistance of the second layer 32 is reduced by applying a prescribed voltage. The second layer 32 functions as a memory layer of data. The second layer 32 may be a single-layer film or a stacked film. The second layer 32 may include, for example, at least one material selected from the group consisting of silicon, $HfO_x$, $ZrO_x$, $NiO_x$, $TaO_x$, $WO_x$, $CoO_x$, $AlO_x$, $FeO_x$, $MnO_x$, $CrO_x$, $VO_x$, $TiO_x$, and $NbO_x$. For example, the second layer 32 may include a single-layer film including this material. For example, the second layer 32 may include a stacked film including this material.

For example, the second oxide includes $TiO_z$ ($1.5 < z < 2.5$) when the first oxide includes $HfO_x$ ($1.5 \leq x < 2.0$).

A thickness t31 of the first layer 31 (referring to FIG. 1B) is, for example, not less than 1 nanometer and not more than 10 nanometers. The thickness t31 is the thickness (the length) of the first layer 31 along a direction (the X-axis direction) perpendicular to the first direction (e.g., the Y-axis direction) and the second direction (the Z-axis direction).

A thickness t32 of the second layer 32 (referring to FIG. 1B) is, for example, not less than 1 nanometer and not more than 20 nanometers. The thickness t32 is the thickness (the length) of the second layer 32 along a direction (the X-axis direction) perpendicular to the first direction (e.g., the Y-axis direction) and the second direction (the Z-axis direction).

By such a thickness t31 and such a thickness t32, for example, the programming voltage Vset that has the appropriate absolute value and the erasing voltage Vreset that has the appropriate absolute value are obtained.

A thickness t2 of the second region 10b is thinner than the thickness t2 of the first region 10a (referring to FIG. 1B). The thickness t2 of the second region 10b is the length of the second region 10b along a direction (e.g., the X-axis direction) perpendicular to the first direction and the second direction. A thickness t1 of the first region 10a is the length of the first region 10a along the perpendicular direction (e.g., the X-axis direction).

The thickness t2 of the second region 10b is, for example, not less than 0.5 nanometers and not more than 10 nanometers. The electrical resistivity of the second region 10b is higher than the electrical resistivity of the first region 10a. By the thickness t2 being 10 micrometers or less, an excessively high electrical resistance of the current path between the first interconnect 10 and the second interconnect 20 can be suppressed. For example, the drive voltage can be low. By the thickness t2 being, for example, 0.5 nanometers or more, the large rectifying factor RF recited above is obtained stably.

The thickness t1 of the first region 10a is, for example, not less than 10 nanometers and not more than 100 nanometers. Thereby, for example, a low resistance is obtained in the first interconnect 10.

A length h1 of the first region 10a along the second direction (e.g., the Z-axis direction) (referring to FIG. 1B) is, for example, not less than 10 nanometers and not more than 100 nanometers. A length h2 of the second region 10b along the second direction (e.g., the Z-axis direction) (referring to FIG. 1B) is not less than 10 nanometers and not more than 100 nanometers. By such lengths, for example, a low resistance is obtained in the first interconnect 10.

Second Embodiment

In a second embodiment, the first interconnect 10 and the second interconnect 20 described in the first embodiment are multiply provided. A memory device that includes the multiple memory cells MC is obtained. An example of a configuration in which the multiple first interconnects 10 and the multiple second interconnects 20 are provided will now be described.

Figure 6:
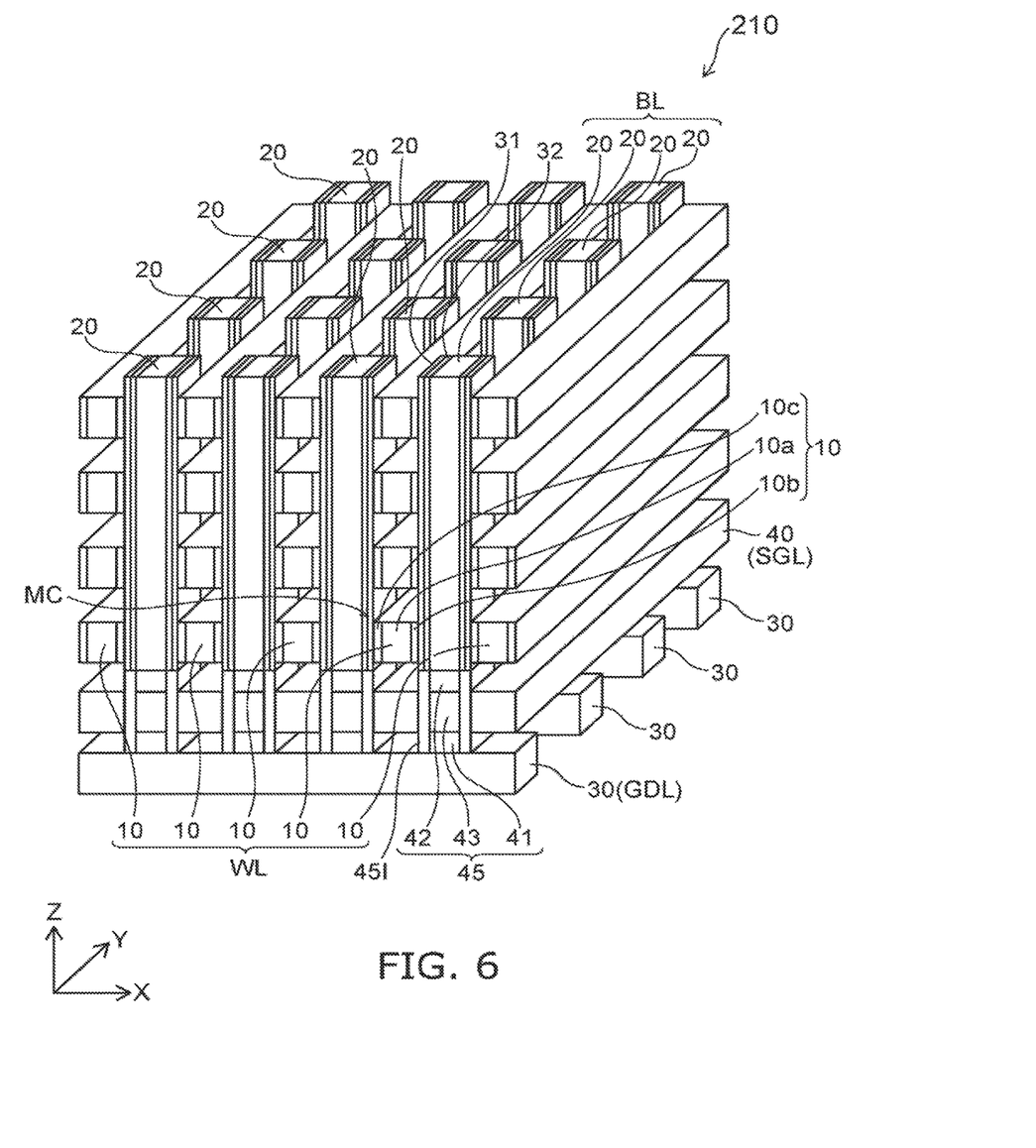
FIG. 6 is a schematic perspective view illustrating the memory device according to the second embodiment.

FIG. 6 is a schematic perspective view illustrating the memory device according to the second embodiment.

A portion of the insulating portions is not illustrated in FIG. 6.

As shown in FIG. 6, the multiple first interconnects 10 and the multiple second interconnects 20 are provided in the memory device 210 according to the embodiment. The memory device 210 further includes a third interconnect 30 and a fourth interconnect 40. Multiple third interconnects 30 and multiple fourth interconnects 40 are provided in the example.

The multiple first interconnects 10 are arranged in the second direction (e.g., the Z-axis direction) and the third direction. The third direction crosses a plane (e.g., the Y-Z plane) including the first direction and the second direction. The third direction is, for example, the X-axis direction. The multiple first interconnects 10 are substantially parallel to each other.

The multiple second interconnects 20 are arranged in the first direction (e.g., the Y-axis direction) and the third direction (e.g., the X-axis direction). The multiple second interconnects 20 are substantially parallel to each other.

One of the multiple third interconnects 30 extends in the third direction (e.g., the X-axis direction). The multiple third interconnects 30 are arranged in the Y-axis direction. The multiple third interconnects 30 are substantially parallel to each other.

One of the multiple fourth interconnects 40 extends in the first direction (the Y-axis direction). The multiple fourth interconnects 40 are arranged in the X-axis direction. The multiple fourth interconnects 40 are substantially parallel to each other.

For example, the multiple first interconnects 10 correspond to word lines WL. The multiple second interconnects 20 correspond to, for example, local bit lines BL. The multiple third interconnects 30 correspond to global bit lines GBL. The multiple fourth interconnects correspond to selection gate lines SGL.

A semiconductor region 45 and an insulating film 451 are provided in the memory device 110. Multiple semiconductor regions 45 and multiple insulating films 451 are provided. One of the multiple semiconductor regions 45 is provided between one of the multiple second interconnects 20 and one of the multiple third interconnects 30. The semiconductor region 45 functions as a portion of a selection transistor. The fourth interconnect 40 functions as a gate electrode of the selection transistor. The insulating film 451 functions as a gate insulating film of the selection transistor.

The fourth interconnect 40 is positioned between the multiple first interconnects 10 and a portion of the third interconnect 30 in the second direction (e.g., the Z-axis direction). The insulating film 451 is provided between the semiconductor region 45 and a portion of the fourth interconnect 40 in the third direction (e.g., the X-axis direction).

A first portion 41 of the semiconductor region 45 is connected to one of the multiple third interconnects 30. A second portion 42 of the semiconductor region 45 is connected to one of the multiple second interconnects 20. The first portion 41 is used as one of a source or a drain of the selection transistor. The second portion 42 is used as the other of the source or drain of the selection transistor. The semiconductor region 45 further includes a third portion 43. The third portion 43 is positioned between the first portion 41 and the second portion 42. The third portion 43 is used as a channel portion of the selection transistor.

The memory cells MC are positioned at the crossing portions between the multiple first interconnects 10 and the multiple second interconnects 20. The memory cells MC are arranged in the X-axis direction, the Y-axis direction, and the Z-axis direction.

Due to the voltage applied to the fourth interconnect 40, the selection transistor is switched ON; and one of the multiple second interconnects 20 corresponding to one of the multiple third interconnects 30 is selected. According to the voltages applied to each of the multiple first interconnects 10, one of the multiple memory cells MC is selected; and the program operation PO, the erase operation EO, and the read operation RO are implemented.

Figure 7:
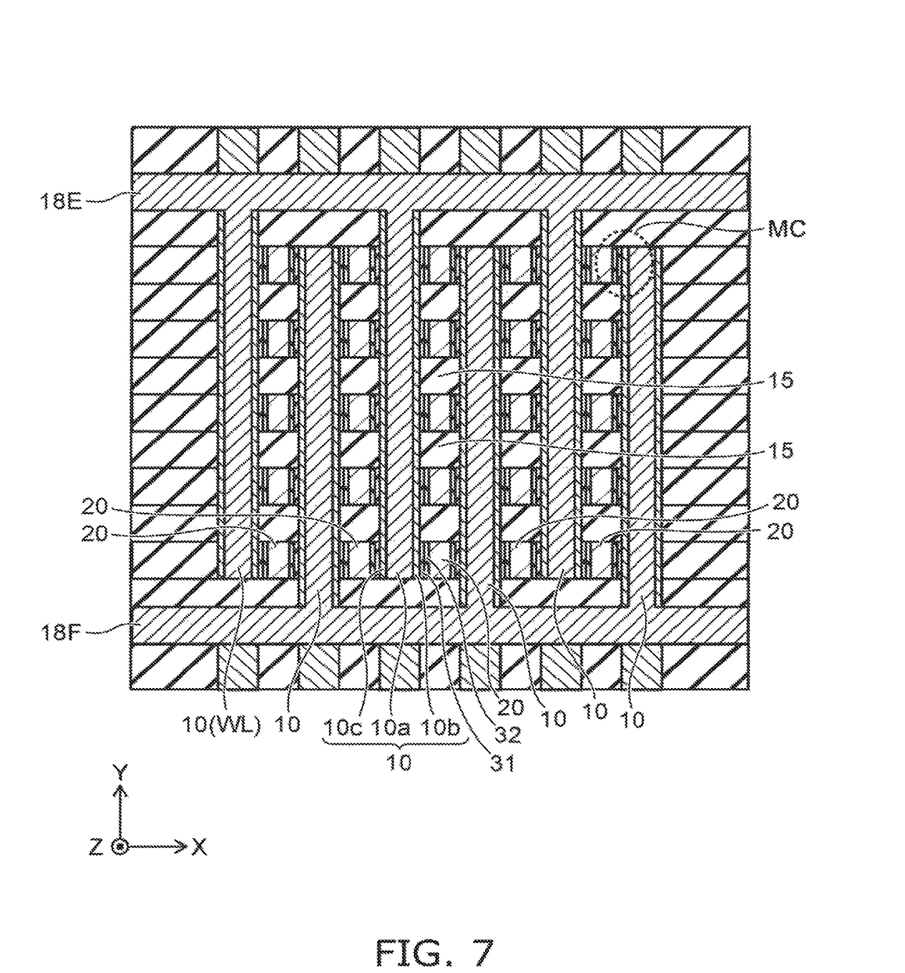
FIG. 7 is a schematic cross-sectional view illustrating a portion of the memory device according to the second embodiment.

FIG. 7 is a schematic cross-sectional view illustrating a portion of the memory device according to the second embodiment.

FIG. 7 is a cross-sectional view when the memory device 210 is cut by the X-Y plane.

As shown in FIG. 7, a first insulating region 15 is provided in the memory device 210. The first insulating region 15 corresponds to, for example, an inter-layer insulating film.

The multiple second interconnects 20 are arranged in the X-axis direction and the Y-axis direction. The first insulating region 15 is provided between the multiple second interconnects 20. For example, a group (a first group) of a portion of the multiple second interconnects 20 is arranged in the first direction (the Y-axis direction). At least a portion of the first insulating region 15 is positioned between the multiple second interconnects 20 included in the first group. The second region 10b of one of the multiple first interconnects 10 is provided between the first region 10a and the at least a portion of the first insulating region 15 recited above (the portion between the multiple second interconnects 20). In other words, the second region 10b of the one of the multiple first interconnects 10 extends in the Y-axis direction together with the first region 10a.

For example, such second regions 10b may be formed by forming trenches extending along the Y-axis direction in a conductive film used to form the first interconnects 10 and by nitriding the surface portions of the conductive film exposed in the trenches. Subsequently, the first layers 31 and the second layers 32 are formed in the remaining space of the trenches. The formation of such second regions 10b is easy. The rectifying portions 35 that are easy to manufacture are obtained.

As shown in FIG. 7, the multiple first interconnects 10 are connected in a comb teeth configuration by a fifth interconnect 18E and a sixth interconnect 18F. The fifth interconnect 18E and the sixth interconnect 18F extend in the third direction (e.g., the X-axis direction). The sixth interconnect 18F is separated from the fifth interconnect 18E in the first direction (the Y-axis direction).

The multiple first interconnects 10 are provided between the fifth interconnect 18E and the sixth interconnect 18F. The multiple first interconnects 10 are arranged in the third direction (e.g., the X-axis direction). Two of the multiple first interconnects 10 are connected to the fifth interconnect 18E. On the other hand, another one of the multiple first interconnects 10 is between the two of the multiple first interconnects 10 recited above in the third direction (e.g., the X-axis direction). One of the multiple first interconnects 10 recited above (the other one recited above) is connected to the sixth interconnect 18F. For example, the odd-numbered interconnects of the multiple first interconnects 10 are connected to the fifth interconnect 18E. The even-numbered interconnects of the multiple first interconnects 10 are connected to the sixth interconnect 18F.

One of the multiple first interconnects 10 is positioned between two of the multiple second interconnects 20 arranged along the X-axis direction. In the first interconnect 10, a third region 10c is provided in addition to the first region 10a and the second region 10b.

The third region 10c extends in the first direction (the Y-axis direction). The second region 10b is positioned between the first region 10a and a portion of one of the two of the multiple second interconnects 20 recited above in the third direction (e.g., the X-axis direction). The third region 10c is positioned between the first region 10a and a portion of the other one of the two of the multiple second interconnects 20 recited above in the third direction (the X-axis direction). The third region 10c includes the first metallic element and nitrogen. For example, the first region 10a includes W. In such a case, the second region 10b includes WN. In such a case, the third region 10c includes WN.

The first layer 31 and the second layer 32 are provided in a region including the first region 10a and a portion of one of the two of the multiple second interconnects 20 recited above. This portion is used as one of the multiple memory cells MC.

Another first layer 31 and another second layer 32 are provided in a region including the first region 10a and a portion of the other one of the two of the multiple second interconnects 20 recited above. This portion is used as another one of the multiple memory cells MC.

Figure 8:
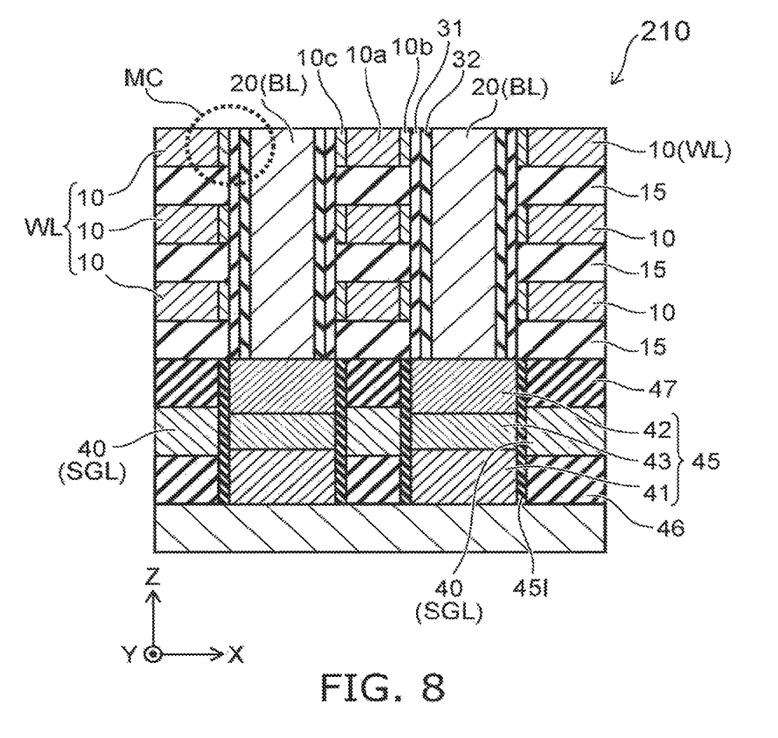
FIG. 8 is a schematic cross-sectional view illustrating a portion of the memory device according to the second embodiment.

FIG. 8 is a schematic cross-sectional view illustrating a portion of the memory device according to the second embodiment.

FIG. 8 is a cross-sectional view when the memory device 210 is cut by the X-Z plane.

The multiple semiconductor regions 45 are provided on the third interconnect 30. The multiple semiconductor regions and the multiple fourth interconnects 40 are arranged alternately along the X-axis direction. The fourth interconnect 40 is positioned between second insulating regions 46 and 47 in the Z-axis direction. The second insulating regions 46 and 47 correspond to inter-layer insulating films.

The multiple first interconnects 10 are arranged in the Z-axis direction. The first insulating region 15 is provided between the multiple first interconnects 10.

Figure 9:
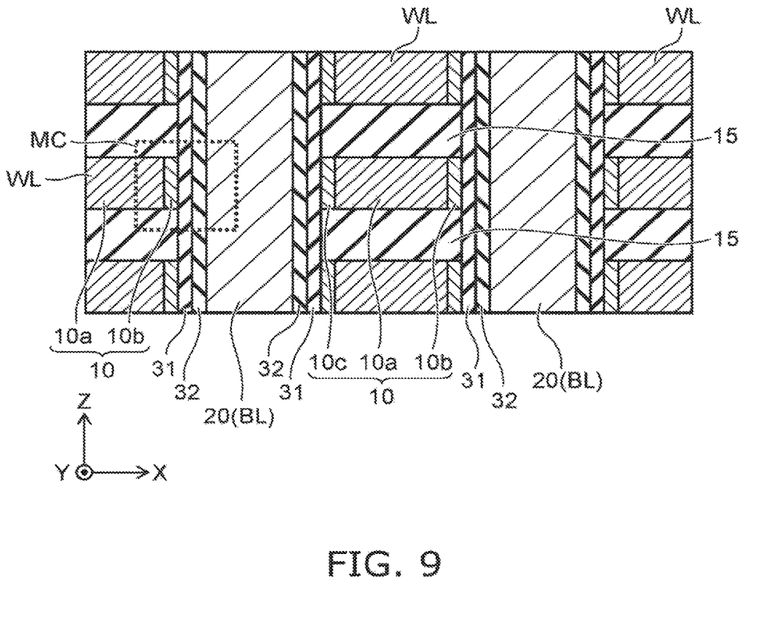
FIG. 9 is a schematic cross-sectional view illustrating a portion of the memory device according to the second embodiment.

FIG. 9 is a schematic cross-sectional view illustrating a portion of the memory device according to the second embodiment.

FIG. 9 is a cross-sectional view when the memory device 210 is cut by the X-Y plane.

FIG. 9 shows an enlargement of a portion of the memory cell MC.

One of the multiple first interconnects 10 is provided between the multiple second interconnects 20 arranged in the X-axis direction. The multiple first interconnects 10 are arranged in the Z-axis direction. The memory cells MC are provided at the crossing portions between the multiple second interconnects 20 and the multiple first interconnects 10.

In such a memory device 210, the direction of the current flowing in one memory cell MC is, for example, the X-axis direction. The short length in the X-axis direction of one memory cell MC leads to a high density memory device.

In a reference example in which, for example, a p-n diode or the like is used as the rectifying element, the p-n diode is arranged in the X-axis direction with the variable resistance layer. The thickness (the length in the X-axis direction) of the p-n diode is thick to obtain the desired rectifying characteristic. Therefore, in the reference example, the length in the X-axis direction per one memory cell MC is longer.

Conversely, in the memory device 210 according to the embodiment, the rectifying portion 35 having a good characteristic is obtained by using the first layer 31 and the second region 10b of the nitride of the appropriate first metallic element. The thickness t31 (the length in the X-axis direction) of the first layer 31 is thin; and the thickness (the length in the X-axis direction) of the second region 10b also is thin. Therefore, stable operations are obtained while maintaining a small size in the X-axis direction.

In the embodiment, the second region 10b of the appropriate material and the first layer 31 of the appropriate material are provided. These materials are determined based on the experimental results in which the appropriate rectifying function is obtained using the combination of the material of the interconnect and the material of the variable resistance layer. The standard electrode potential of the first metallic element included in the portion (the second region 10b) contacting the first layer 31 is set to be large. The first metallic element that does not oxidize easily is used. A rectifying characteristic that has a good characteristic is obtained by providing a nitride of such a first metallic element in the second region 10b.

The configuration of the memory device according to the embodiment is simple. According to the embodiment, a variable resistance element and a memory device can be provided in which stable operations are possible.

In this specification, the state of being electrically connected includes the state in which two conductors are in direct contact. The state of being electrically connected includes the state in which two conductors are connected by another conductor (e.g., an interconnect, etc.). The state of being electrically connected includes the state in which a switching element (a transistor or the like) is provided on a path between two conductors, and a state is formable in which a current flows in the path between the two conductors.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as interconnects, layers, insulating regions, insulating films, and semiconductor regions, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A memory device, comprising:
 a first interconnect including a first region and a second region, the first region extending in a first direction and including a first metallic element, the second region extending in the first direction and including the first metallic element and nitrogen;

a second interconnect extending in a second direction crossing the first direction, a portion of the second region being positioned between the second interconnect and a portion of the first region;

a first layer provided between the second interconnect and the portion of the second region, the first layer including a first oxide including at least one element selected from the group consisting of hafnium (Hf), zirconium (Zr), nickel (Ni), tantalum (Ta), tungsten (W), cobalt (Co), aluminum (Al), iron (Fe), manganese (Mn), chrome (Cr), vanadium (V), titanium (Ti), and niobium (Nb); and a second layer provided between the first layer and the second interconnect, the second layer including at least one of silicon or a second oxide, the silicon being monocrystalline, polycrystalline, or amorphous, the second oxide including at least one element selected from the group consisting of hafnium (Hf), zirconium (Zr), nickel (Ni), tantalum (Ta), tungsten (W), cobalt (Co), aluminum (Al), iron (Fe), manganese (Mn), chrome (Cr), vanadium (V), titanium (Ti), and niobium (Nb); and a first insulating region, a plurality of the second interconnects being provided, a first group of the plurality of second interconnects being arranged in the first direction, at least a portion of the first insulating region being positioned between the plurality of second interconnects included in the first group, the second region being further provided between the first region and the at least the portion of the first insulating region.

2. The memory device according to claim 1, further comprising:

a third interconnect extending in a third direction crossing a plane, the plane including the first direction and the second direction;

a fourth interconnect extending in the first direction, the fourth interconnect being positioned between the first interconnect and a portion of the third interconnect in the second direction;

a semiconductor region provided between the third interconnect and one of the plurality of second interconnects; and an insulating film, the insulating film being provided between the semiconductor region and a portion of the fourth interconnect in the third direction.

3. The memory device according to claim 2, further comprising:

a fifth interconnect extending in the third direction; and a sixth interconnect extending in the third direction and being separated from the fifth interconnect in the first direction, a plurality of the first interconnects being provided between the fifth interconnect and the sixth interconnect, the plurality of first interconnects being arranged in the third direction, two of the plurality of first interconnects being connected to the fifth interconnect, another one of the plurality of first interconnects being between the two of the plurality of first interconnects in the third direction, the other one of the plurality of first interconnects being connected to the sixth interconnect.

4. The memory device according to claim 2, wherein one of the plurality of first interconnects is positioned between two of the plurality of second interconnects, the one of the plurality of first interconnects further includes a third region extending in the first direction, the third region includes the first metallic element and nitrogen, the second region is positioned between the first region and a portion of one of the two of the plurality of second interconnects in the third direction, the third region is positioned between the first region and a portion of the other one of the two of the plurality of second interconnects in the third direction.

5. The memory device according to claim 1, wherein a thickness of the second region along a direction perpendicular to the first direction and the second direction is thinner than a thickness of the first region along the perpendicular direction.

6. The memory device according to claim 1, wherein the first oxide includes $HfO_x$ ($1.5 \leq x < 2.0$).

7. The memory device according to claim 1, wherein the first oxide includes $HfO_x$ ($1.5 \leq x < 2.0$), and the second oxide includes $TiO_z$ ($1.5 < z < 2.5$).

8. The memory device according to claim 1, wherein the first layer contacts the second layer.

9. A memory device, comprising:

a first interconnect including a first region and a second region, the first region extending in a first direction and including a first metallic element, the second region extending in the first direction and including the first metallic element and nitrogen, a second direction from the first region toward the second region crossing the first direction, the first region including a third region, a fourth region, and a fifth region, a direction from the third region toward the fourth region being along the first direction, the fifth region being positioned between the third region and the fourth region, the second region including a sixth region, a seventh region, and a an eighth region, the eighth region being positioned between the sixth region and the seventh region;

a plurality of second interconnects extending in a third direction crossing a plane including the first direction and the second direction, the sixth region being positioned between one of the second interconnects and the third region, the seventh region being positioned between another one of the second interconnects and the fourth region;

a first layer provided between the one of the second interconnects and the sixth region and between the other one of the second interconnects and the seventh region, the first layer including a first oxide including at least one element selected from the group consisting of hafnium (Hf), zirconium (Zr), nickel (Ni), tantalum (Ta), tungsten (W), cobalt (Co), aluminum (Al), iron (Fe), manganese (Mn), chrome (Cr), vanadium (V), titanium (Ti), and niobium (Nb); and a second layer provided between the first layer and the one of the second interconnects and between the first layer and the other one of the second interconnects, the second layer including at least one of silicon or a second oxide, the silicon being monocrystalline, polycrystalline, or amorphous, the second oxide including at least one element selected from the group consisting of hafnium (Hf), zirconium (Zr), nickel (Ni), tantalum (Ta), tungsten (W), cobalt (Co), aluminum (Al), iron (Fe), manganese (Mn), chrome (Cr), vanadium (V), titanium (Ti), and niobium (Nb).

10. The memory device according to claim 9, wherein the first metallic element includes at least one selected from the group consisting of tungsten (W) and tantalum (Ta).

11. The memory device according to claim 9, wherein the first metallic element includes tungsten (W).

12. The memory device according to claim 9, wherein an oxygen composition ratio of the first oxide is lower than a stoichiometric oxygen composition ratio of the first oxide.

13. The memory device according to claim 9, wherein the first oxide includes hafnium.

14. The memory device according to claim 9, wherein the first oxide includes $HfO_x$ ($1.5 \leq x < 2.0$).

* * * * *